United States Patent
Zalud et al.

(10) Patent No.: US 6,452,980 B1
(45) Date of Patent: Sep. 17, 2002

(54) ENCODING/DECODING SYSTEM FOR COHERENT SIGNAL INTERFERENCE REDUCTION

(75) Inventors: Peter Zalud, New Hope, PA (US); Jonathan Schepps, Princeton Junction, NJ (US); Robert Evans, Cranbury, NJ (US); Min-Long Lin, Plainsboro, NJ (US)

(73) Assignees: Sarnoff Corporation, Princeton, NJ (US); Secom Company, LTD, Mitaka (JP)

( * ) Notice: Subject to any disclaimer, the term of this patent is extended or adjusted under 35 U.S.C. 154(b) by 0 days.

(21) Appl. No.: 09/480,776

(22) Filed: Jan. 10, 2000

(51) Int. Cl.$^7$ .............................................. H04B 15/00
(52) U.S. Cl. ....................... 375/285; 375/296; 375/340; 375/282; 340/505; 342/42
(58) Field of Search ................................. 375/282, 285, 375/296, 333, 340; 342/42, 44, 45, 51; 340/825.34, 505, 10.1, 10.3, 10.4, 10.42

(56) References Cited

U.S. PATENT DOCUMENTS

| | | |
|---|---|---|
| 4,730,188 A | 3/1988 | Milheiser .................... 340/825 |
| 4,906,853 A | 3/1990 | Linwood et al. ............. 250/551 |
| 5,211,129 A | 5/1993 | Taylor et al. ................ 119/215 |
| 5,245,346 A * | 9/1993 | Nishimura et al. ............ 342/42 |
| 5,293,399 A | 3/1994 | Hefti ....................... 340/10.34 |
| 5,491,482 A | 2/1996 | Dingwall et al. .............. 342/42 |
| 5,502,445 A * | 3/1996 | Dingwall et al. .............. 342/51 |
| 5,883,592 A * | 3/1999 | Schepps et al. ............... 342/44 |
| 6,081,222 A * | 6/2000 | Henkel et al. ................. 342/45 |

OTHER PUBLICATIONS

International Search Report, Apr. 10, 2001.

* cited by examiner

Primary Examiner—Stephen Chin
Assistant Examiner—Chieh M. Fan
(74) Attorney, Agent, or Firm—William J. Burke (57) ABSTRACT

An apparatus is described for reducing coherent signal interference between at least two bit streams framed with a common clock signal. The apparatus includes an internal clock signal generated from the common clock signal and a Manchester encoder for encoding the internal clock signal with a unique signature. Also included is a logic AND-gate for combining one bit stream of the two bit streams with the encoded clock signal to produce an encoded output signal. When the encoded output signal is combined with another of the two bit streams during transmission, individual bits of the combined bit streams are identifiable at a receiving end. The receiving end decodes the combined bit streams and properly discriminates between ONEs and ZEROs.

17 Claims, 7 Drawing Sheets

ENCODING/DECODING SYSTEM FOR COHERENT SIGNAL INTERFERENCE REDUCTION

TECHNICAL FIELD

The present invention relates, in general, to systems transmitting/receiving data and, more specifically, to a system and method for encoding/decoding of data to reduce coherent signal interference.

BACKGROUND OF THE INVENTION

Use of radio frequency as a data communications link in interrogation/identification (I/I) systems is well known. U.S. Pat. No. 5,491,482 describes coded objects, such as bank credit cards, employee identification (ID) badges, coded tags and the like, that may be read on-the-fly from some feet away by an interrogator/reader (I/R). Portions of the description of the I/I system in the patent are included below.

Figure 1:
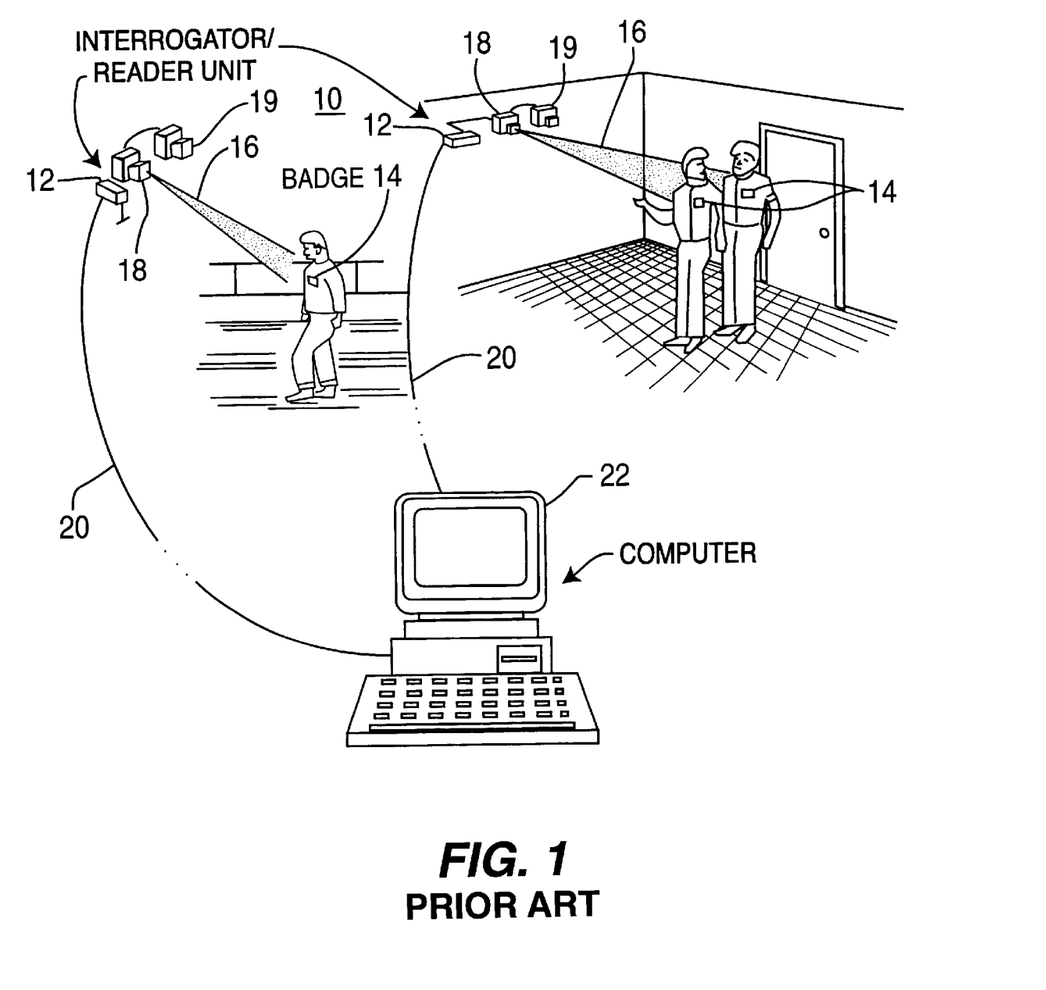
FIG. 1 (prior art) is a schematic illustration of a conventional I/I system employing an I/R unit and multiple, electronically coded tags.

Referring to FIG. 1, there is shown I/I system 10 including one or more I/R units 12, one or more badges 14, respective transmit and receive antennas 18 and 19, and a central computer 22. I/R units 12 operate at a suitable radio frequency or microwave frequency (e.g. 915 MHz or 5.8 GHz) and transmit microwave (radio frequency) beams 16. Badges 14 (which uniquely identify individual employees) are internally powered and are interrogated by respective beams 16 transmitted from directional antennas 18 of I/R units 12 positioned at selected locations. Each I/R unit 12 has a receiving antenna 19 which is closely similar to transmitting antenna 18. I/R units 12 are connected via respective cables 20 to a desktop computer 22. In the course of being interrogated via microwave beam 16 from I/R unit 12, a badge or badges 14 reply electronically by reflecting a portion of the same beam 16 back to receiving antenna 19 of I/R unit 12. Badges 14 thus uniquely identify themselves in accordance with their respectively coded and electronically stored ID numbers.

Each badge may be coded with any one of over 60 billion different numbers. By way of example, five or so different badges 14 may at one time be interrogated and identified (when in range of detection) by a respective I/R unit 12 in less than 20 milliseconds. As soon as badge 14 has been identified, its electronic circuit is put into an inactive or "power down" state, so that badge 14 does not continue to respond to I/R unit 12 for as long as that badge (once it has been identified) remains within range of the respective beam 16. Once badge 14 is moved out of range of beam 16, the electronic circuit of badge 14 automatically returns to a quiescent state drawing negligible current from its internal power source. But even in quiescent state, badge 14 has sufficient input sensitivity so that the badge remains able to detect and respond to very low power density levels of beam 16. By way of example, the power density of beam 16 immediately in front of transmitting antenna 18 of I/R unit 12 is only about 0.3 mW/cm$^2$, which is one-tenth the level set by health and safety standards. The power density of beam 16 at the location of badge 14 is substantially lower.

A typical badge includes a badge-integrated-circuit (BIC), an antenna, and a very thin battery placed on a small, insulated PC board. The BIC may be entirely implemented in complementary metal oxide semiconductor (CMOS) technology, as a single IC chip. The thickness of the badge is only slightly greater than the thickness of the battery. For example, the battery may be a lithium battery having a thickness of about 30 mils, a rating of 3 volts and a capacity of 50 mA-hr. The average current drain of the BIC is less then 1 microampere, and the service life of the battery is effectively its shelf life (e.g., four years or more).

Figure 2:
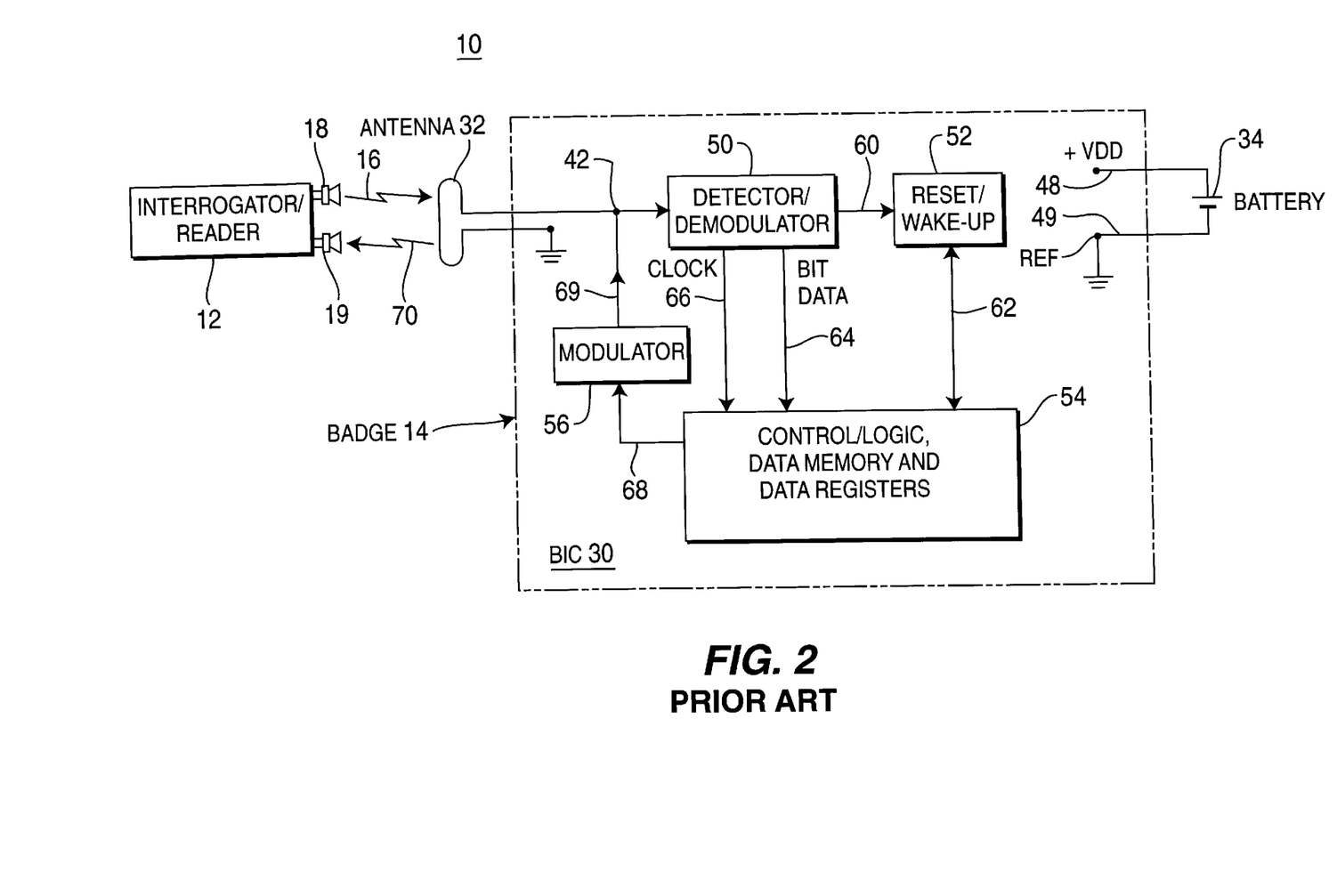
FIG. 2 (prior art) is a block diagram partly in schematic diagram form of a conventional I/R unit and a single tag of the system of FIG. 1.

Referring now to FIG. 2, there is shown a simplified schematic diagram of I/I system 10. This system includes I/R unit 12 with its beam 16, transmission antenna 18, receiving antenna 19, BIC 30, antenna 32 and battery 34. Beam 16 is received by antenna 32 and a RF voltage is applied as an input signal to terminal 42 of BIC 30. The positive terminal of battery 34 is connected to lead 48 which is coupled to a terminal +VDD and the negative terminal of battery 34 is connected to lead 49 which is coupled to a reference terminal (REF) shown coupled to ground potential. The circuitry of the BIC includes detector/demodulator block 50, a reset/wake-up block 52, a control/logic, data memory and data registers block 54, and modulator 56.

Incoming coded signals (described in detail in U.S. Pat. No. 5,491,482) on beam 16 are detected and demodulated in block 50, which is always turned on. Other portions of BIC 30, when not in range of beam 16, are turned off. When a "reset" instruction from I/R unit 12 is detected and demodulated by block 50, block 50 applies a "reset" data word via path 60 to reset/wake-up block 52, which in turn applies a power-on signal via path 62 to the control/logic, data memory and data registers block 54. Bit data and clock signals from block 50 are applied, via paths 64 and 66, to block 54 in response to the instructions and coded words being received by BIC 30 from I/R unit 12.

By way of example, an identifying number for an employee to which a particular badge 14 is assigned is in the form of six 6-bit words stored in six memory registers (identified as A through F) in block 54 of BIC 30. To identify this 36-bit number, I/R unit 12 interrogates each badge 14 word by word. BIC 30, by operation of its modulator block 56, via path 69, then replies to I/R unit 12 at appropriate intervals, until badge 14 has completely identified itself. This iterative procedure is described in detail in U.S. Pat. No. 5,491,482.

The I/R unit transmits to the tags at a suitable frequency a stream of binary bits of instruction and data words, and receives responses from each tag. Each of the tags has circuitry for storing, as digital bits, an identifying code number. The circuitry of each tag detects and demodulates the incoming bit stream from the I/R unit, and generates clock and timing signals slaved to the bit stream, thereby framing the incoming digital words. The circuitry has logic for responding internally to the instruction and data words of the bit stream and for responding externally to the I/R unit at selected times such that the code number of a tag is uniquely identified and that tag alone among many communicates solely with the I/R unit when so identified.

Several steps are necessary before a tag is uniquely identified. A first step includes transmitting a bit stream of instruction and data words to each and all tags present to determine the presence of at least one tag. A next step is sequentially sorting through all possible combinations of values of the plurality of coded words stored in each and all tags. A next step is tabulating the matches found between transmitted and stored words of each and all tags and responding by the tag when a match is found. A next step is determining that at least one tag has matches with all of its stored words; and a next step is transmitting instruction and data words to the tags to sort out all possible combinations of matched words in all of the tags which have responded. A last step is responding by the tags one-by-one when each is uniquely identified.

The tag described in U.S. Pat. No. 5,491,482 independently generates an internal clock signal that bears no relationship to the I/R transmitted carrier signal. Other conventional I/I systems, however, generate an internal clock signal from the I/R transmitted carrier signal. For example, each tag (or card) in I/I system 10 may generate its own clock signal 66 from the I/R transmitted carrier signal, by dividing the carrier signal from I/R 12 by a fixed number. When each tag generates its internal clock signal from the interrogator's carrier signal, the tag's internal clock signal is "coherent" with the carrier signal. Since a plurality of tags may concurrently be interrogated by an I/R, the coherent signals may interfere with each other.

The problem of coherent signal interference is explained by reference to FIGS. 3(a)–(f) and 4(a)–(f). The figures illustrate various waveforms, labeled 80–85. First waveform 80 is the common clock signal (interrogator's carrier). Waveforms 81 and 82 are the internally generated clock signals, clock A and clock B in tags A and B, respectively. Clock A or clock B may be output on path 66 from block 50, as shown in FIG. 2. Each tag in the I/I system may generate its clock signal by dividing the common interrogator's carrier signal by a predetermined number. In the example shown in FIGS. 3 and 4, the predetermined number is 2.

Figure 3:
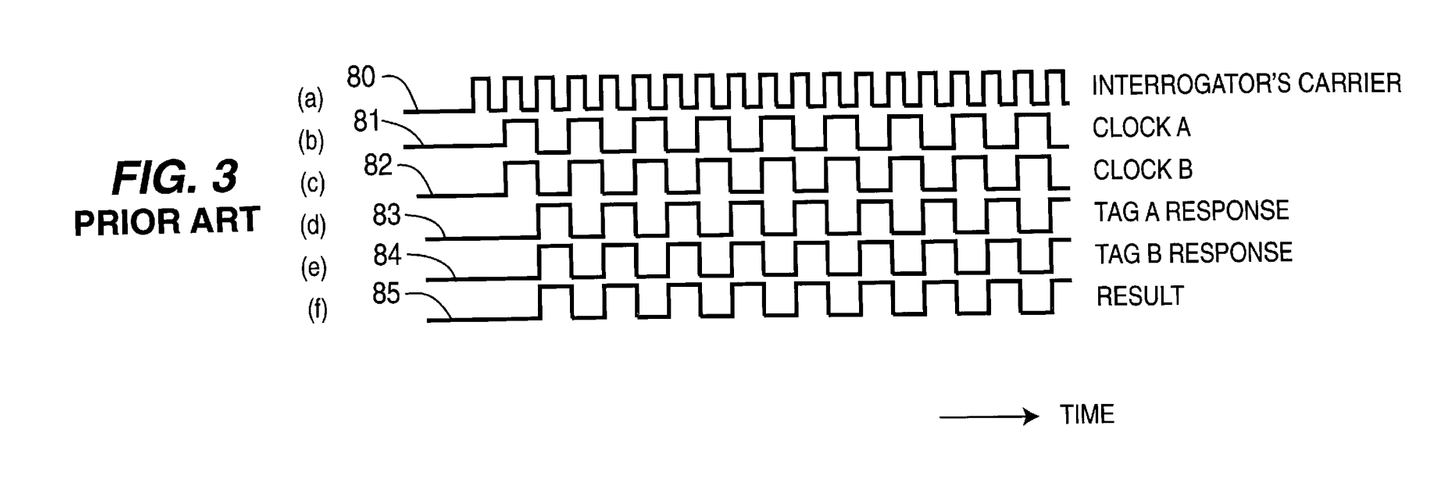
Figure 4:
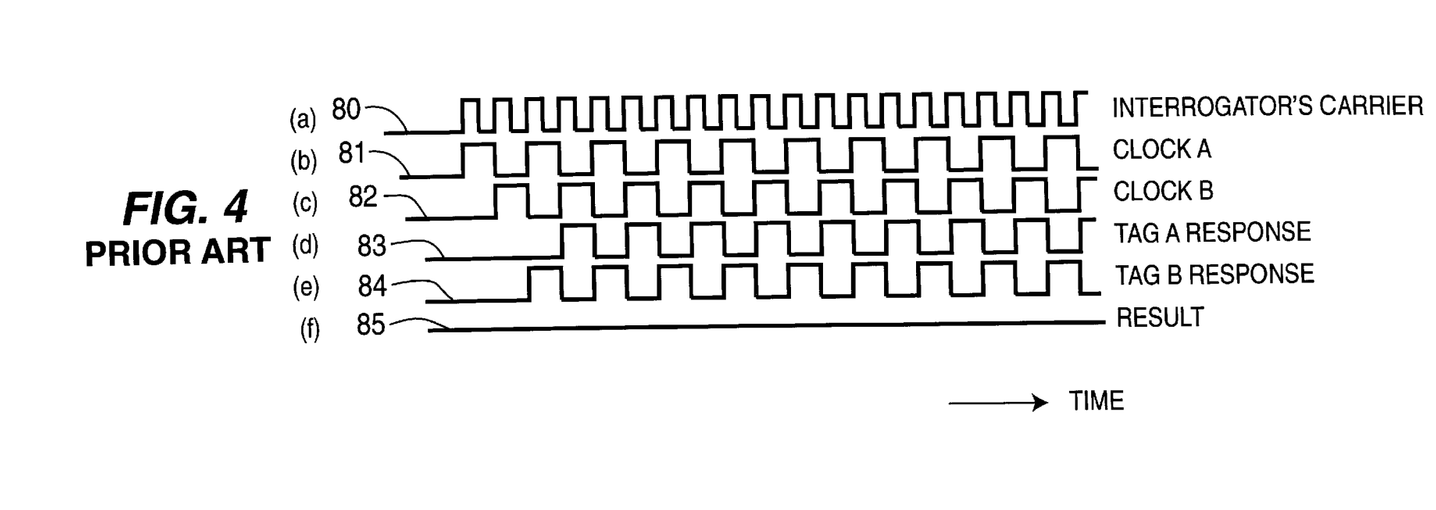

Although not shown, it will be understood that each tag responds with a data stream of logical ONEs and ZEROs. The bit time period of each logical ONE or ZERO typically is longer than a clock cycle. For example, there may be 36 clock cycles within a bit time period. In FIGS. 3 and 4, for example, the duration of a bit time period is longer than the duration of all the combined clock pulses shown in each figure.

Depending on tolerance variations among tags, each tag may start a division of the carrier signal at a different time. For example, in FIG. 3 clock A of tag A and clock B of tag B are in phase. In FIG. 4, however, clock A and clock B are out of phase.

A tag may generate a response produced by block 54 (FIG. 2) by on/off key modulation for a predetermined number of clock periods. The responses from tag A and tag B are designated 83 and 84, respectively. As previously stated, tag A response 83 and tag B response 84 are actually the clock modulations within one bit time period. As the response signals propagate toward the I/R, the signals interfere with each other. When the response signals are in phase, as shown in FIG. 3, the response signals combine to produce a strong signal, depicted as result 85. When the response signals are out of phase, however, the result is shown in FIG. 4 and the I/R does not receive any signal.

Thus, when several tags respond concurrently to an interrogator's query, coherent signal interference exists. Depending on the phase shifts among the response signals from the tags, the resulting signal received by the I/R varies in amplitude. In some cases, the amplitude may approach zero and detection by the I/R is impossible. While it is possible to develop algorithms to prevent concurrent responses from several cards, these algorithms are slow and become even slower as the number of tags increase in the entire tag population (address space).

The problem of coherent signal interference shows that a need exists to provide an apparatus and method for reducing the signal interference among coherent signals.

SUMMARY OF THE INVENTION

The present invention provides an apparatus for reducing coherent signal interference between at least two bit streams framed with a common clock signal. The apparatus generates a local clock signal from the common clock signal and includes a Manchester encoder for encoding the clock signal with a unique signature. Also included is a logic AND-gate for combining one bit stream of the two bit streams with the encoded clock signal to produce an encoded output signal. When the encoded output signal is combined with another of the two bit streams during transmission, individual bits of the combined bit streams are identifiable at a receiving end.

The exemplary encoder includes a re-circulating shift register having a serial output, a serial input, a parallel input and a clock input. The serial output of the shift register is fed back to the serial input. The clock signal is provided to the clock input of the shift register and the unique signature is provided to the parallel input. An exclusive-OR circuit combines the serial output signal of the shift register and the clock signal to produce the encoded clock signal. The unique signature is a user selected bit pattern, and it is unique to each tag in the tag population and is loaded into the parallel input of the shift register once during initialization. The shift register has a length equal to a length of the user selected bit pattern, and the bit pattern is re-circulated once for every bit time period. The bit time period is defined as $n=F/DP$, where F is a frequency of the clock signal in Hz, and DP is the bit rate of the bit stream in bits per second.

In another embodiment, a discriminator circuit is disclosed for decoding a bit stream containing ONEs and ZEROs, each ONE or ZERO having a bit time period. The discriminator circuit receives the bit stream, where the bit stream includes pulses framed with a common clock signal, and a local clock signal generated from the common clock signal. A first counter receives the bit stream and is clocked by the clock signal. The first counter determines that a ONE is present in the bit stream when at least one pulse is detected during a bit time period. A second counter receives the bit stream and is clocked by the clock signal. The second counter determines that a ZERO is present when no pulses are detected during the bit time period.

It is to be understood that both the foregoing general description and the following detailed description are exemplary, but are not restrictive, of the invention.

BRIEF DESCRIPTION OF THE DRAWINGS

The invention is best understood from the following detailed description when read in connection with the accompanying drawing. Included in the drawing are the following figures:

FIGS. 3(a)–3(f) (prior art) are timing diagrams showing the result of two conventional tags responding to an I/R carrier signal, where the two responses are in-phase;

FIGS. 4(a)–4(f) (prior art) are timing diagrams showing the result of two conventional tags responding to an I/R carrier signal, where the two responses are out-of-phase and when combined result in zero signal;

FIGS. 7(a)–7(f) are timing diagrams showing the result of two tags, each containing the encoder of FIG. 5, responding to an I/R carrier signal, where the two responses are in-phase;

FIGS. 8(a)–8(f) are timing diagrams showing the result of two tags, each containing the encoder of FIG. 5, responding to an I/R carrier signal, where the two responses are out-of-phase;

FIGS. 10(a)–10(k) are timing diagrams illustrating the operation of the discriminating decoder of FIG. 9.

DETAILED DESCRIPTION OF THE INVENTION

Figure 5:
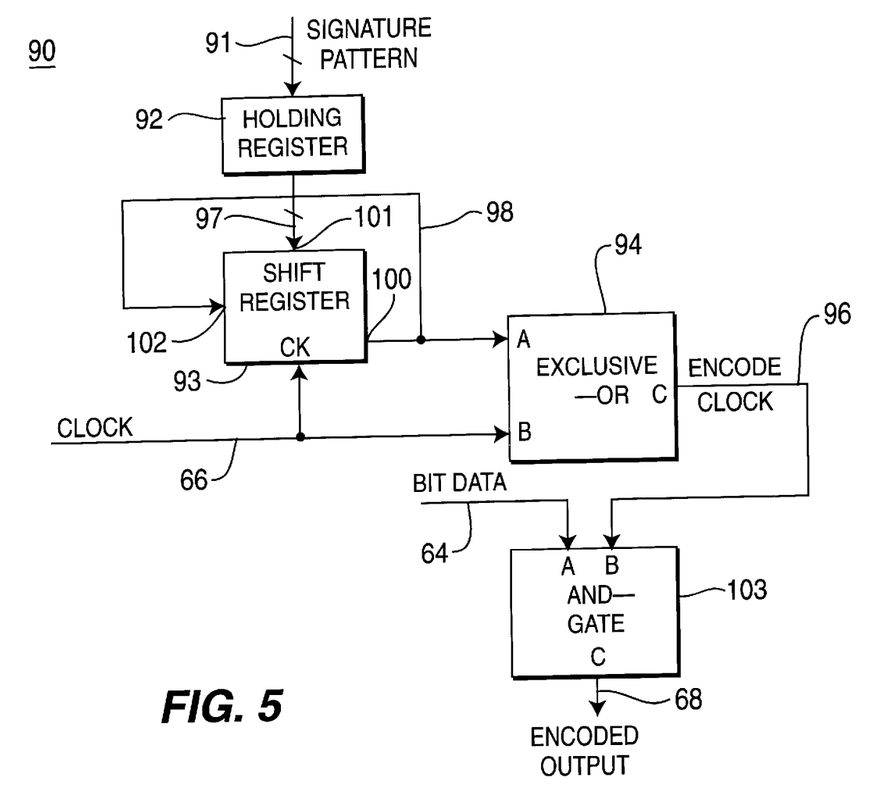
FIG. 5 is a schematic diagram showing an encoder in accordance with an embodiment of the present invention.

In accordance with one embodiment of the present invention, FIG. 5 shows a signature generator, generally designated by 90. The signature generator includes holding register 92, shift register 93 and exclusive-OR logic block 94. Provided as input signals to signature generator 90 are signature pattern 91, clock signal 66 and bit data 64. Provided as an output signal from the signature generator is encoded output signal 68.

It will be appreciated that each tag (or card) in the tag population includes the signature generator. For example, the signature generator may be included in tag 14, shown in FIG. 6. As shown, signature generator 90 is included in control/logic, data memory and data registers block 54. Signature pattern 91 is provided by signature pattern selector 92 and is user controlled. For example, a unique signature may be selected by a user via an authorized programming sequence. Signature pattern 91 may be a 36-bit ID code, or it may be any other length of code. Thus, each tag in a tag population that may be detected by any one I/R unit has a binary number assigned to it providing a unique signature pattern.

Figure 6:
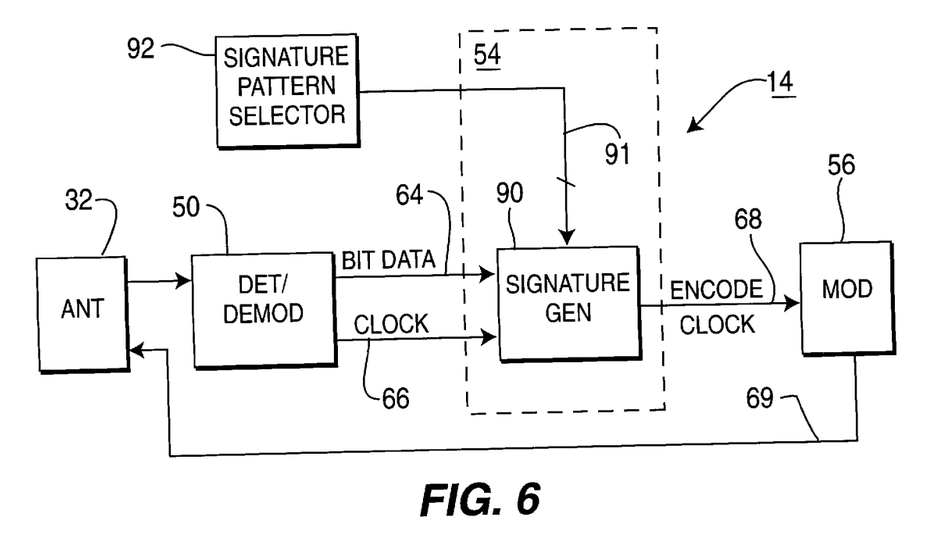
FIG. 6 is a schematic diagram showing the encoder of FIG. 5 embodied in the tag of FIG. 2.

Also shown in FIG. 6 are clock signal 66 and encoded output signal 68, which are an input signal to and an output signal from signature generator 90, respectively. These signals are the same as the signals shown in FIG. 2 and are, therefore, designated by similar numerals. As will be described, clock signal 66 is modulated with signature pattern 91 using Manchester (bi-phase) encoding to produce encoded output signal 68. The encoded output signal is then conventionally modulated by modulator 56 and transmitted from antenna 32 to the interrogator/reader. In this manner, the response of each tag has a unique pattern.

Referring now to FIG. 5, the encoding of the response by a tag or card is accomplished by signature generator 90. Signature pattern 91 is stored in holding register 92, which may be, for example, an EPROM. The output terminal of holding register 92 is connected to input terminal 101 of shift register 93 by way of parallel interconnect 97. Serial output terminal 100 of shift register 93 is connected back to serial input terminal 102 of shift register 93 by way of line 98. Line 98 is also connected to input terminal A of exclusive-OR circuit 94. Clock signal 66 is provided to the clock input terminal CK of shift register 93 and to input terminal B of exclusive-OR circuit 94. Finally, output terminal C of exclusive-OR circuit 94 provides the Manchester-encoded clock signal by way of line 96. The encoded clock signal and bit data 64 are AND-ed by AND-gate 103 to produce encoded output signal 68. After modulation, the encoded output signal becomes the response signal of the tag.

In operation, the signature pattern is loaded into shift register 93 once during initialization of the tag. The signature pattern is then re-circulated once for every response-time period of the tag. The frequency of clock signal 66 may equal the frequency of the response carrier signal. For example, if the carrier frequency is Fc [Hz] and the bit rate is DP [bps], the bit time period is then n=Fc/DP cycles of clock signal 66. It will be appreciated that there will be n clock cycles within one bit time period. For example, there may be 36 clock cycles within one bit time period used by the tag for responding with a logic ONE or ZERO. Furthermore, the length of the signature pattern is equal to the length of the re-circulating shift register 93 and it is k≦n. In cases when k<n is chosen, clock signal 66 should be switched off for p=n−k cycles.

Figure 7:
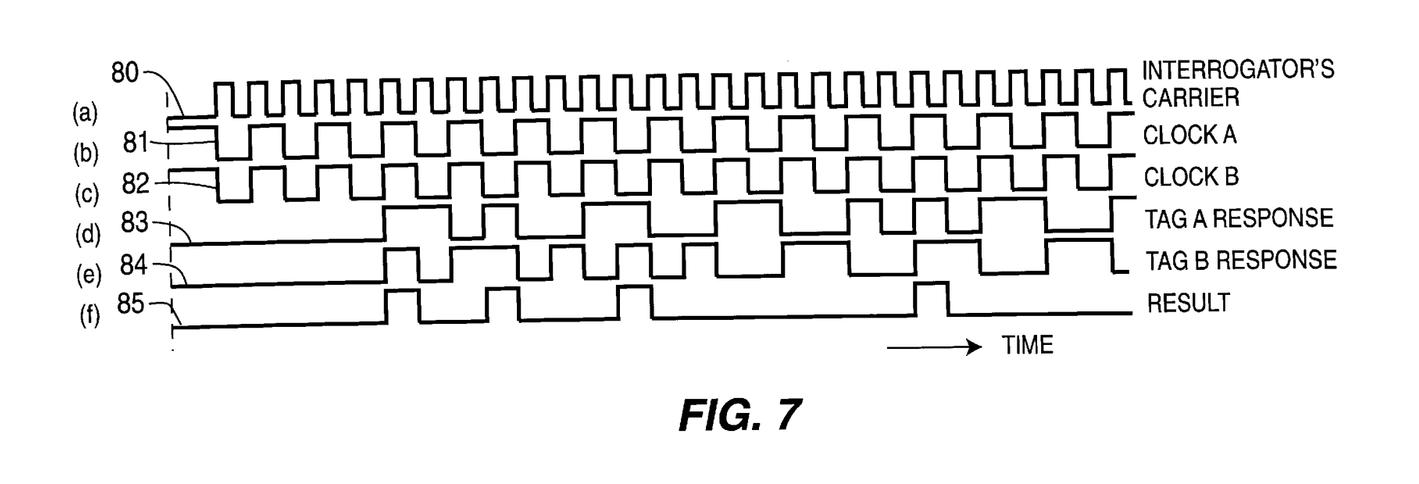
Figure 8:
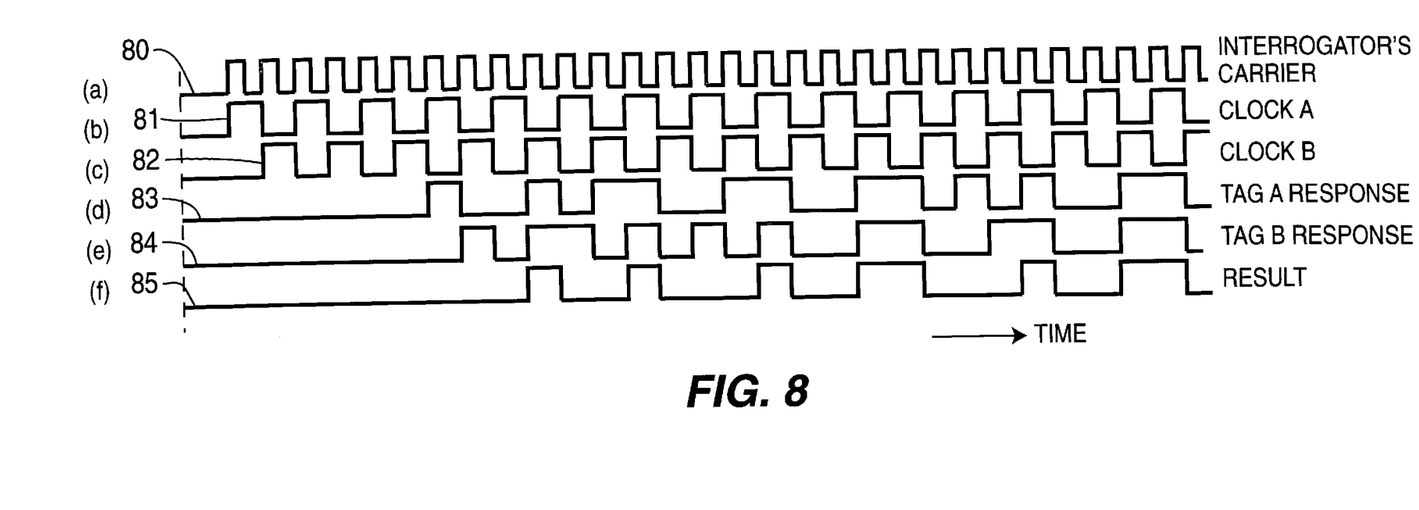

By Manchester encoding the response of the tag with the unique signature pattern of the tag, the problem of coherent signal interference among tags responding simultaneously to an I/R is reduced. FIGS. 7(a)–(f) and 8(a)–(f) illustrate the reduction of interference resulting from Manchester encoding, when two response signals are combined in the air. The figures show the same signals shown in FIGS. 3 and 4, respectively. Clock A of tag A and clock B of tag B are generated from the interrogator's carrier signal 80. Clock A and clock B may be a divisible number of the carrier frequency. In FIGS. 7 and 8, the tag's clock signal is obtained by dividing the carrier signal by a fixed number, for example by 2.

By Manchester encoding clock A of tag A and clock B of tag B with unique signature patterns, the resulting combined signal in the air survives. For example, signature pattern 91 for tag A may be $123456_{HEX}$ and signature pattern 91 for tag B may be $789ABC_{HEX}$. FIG. 7 shows tag A response signal 83 and tag B response signal 84, when clock A signal 81 and clock B signal 82 are in phase and have been encoded with their respective signature patterns. (Only a portion of one response bit time period is illustrated.) Similarly, FIG. 8 shows the same response signals when clock A signal 81 and clock B signal 82 are out of phase. Although the resulting signal 85 depends on the unique patterns of tag A and tag B and is different depending on whether the two tags operate in-phase or out-of-phase, the resulting signal can be detected and recognized by the interrogator. The circuitry for correct detection and recognition of these signals is described below with reference to FIG. 9.

Tag A response 83 and tag B response 84 shown in FIGS. 7 and 8 actually represent the encoded clock signal modulation within less than a single bit time period. (The bit time period is longer than the coding shown as tag A response 83 and tag B response 84.) This may also be understood by referring to FIG. 5. When bit data 64 is a logical ONE during a single bit time period, then encoded output signal 68 (tag A response 83 or tag B response 84) is the modulation of encoded clock signal 96.

It will also be noted that tag B response 84 in FIG. 8 is the same as tag B response 84 in FIG. 7. Tag A response 83 in FIG. 8, however, is the inverse of tag A response 83 in FIG. 7, because the clocks are shifted by 180 degrees.

Figure 9:
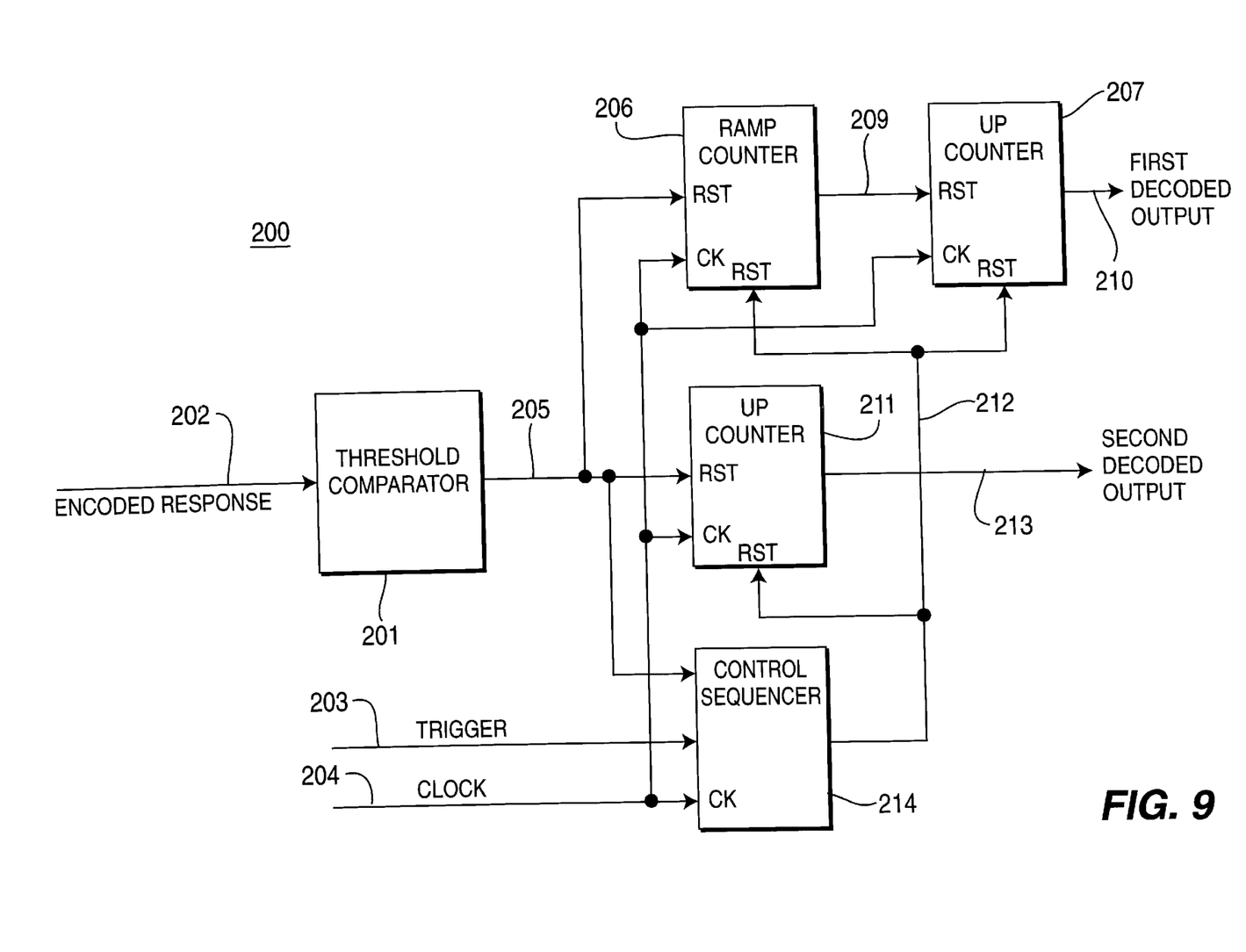
FIG. 9 is a schematic diagram showing a discriminating decoder in accordance with another embodiment of the present invention.

The decoding circuitry is shown in FIG. 9 and is generally designated as 200. As shown, decoder 200 has three input signals, namely encoded response signal 202, trigger signal 203 and clock signal 204. It will be appreciated that decoder 200 may be comprised of discrete components or may be part of a programmable gate array and is included in the interrogator/reader (I/R) unit 12 (FIG. 1). Encoded response 202 may be provided by an RF section (not shown) after having been received and amplified. Of course, the encoded response signal is herein the combined signal transmitted by one or more tags. The second input signal, trigger signal 203, may be provided by a processor (not shown), and the third input signal, clock signal 204, may be provided by a clock generator (not shown). In the embodiment of the present invention, clock signal 204 is coherent with encoded response signal 202.

Referring again to FIG. 9, threshold comparator 201 converts received encoded response signal 202 to voltage levels compatible with the logic. The converted or shaped signal is output by threshold comparator 201 as signal 205 and is shown, for example, as signal 205 in FIG. 10(b). Although not shown, the threshold of the comparator may be set just above the signal noise level.

Figure 10:
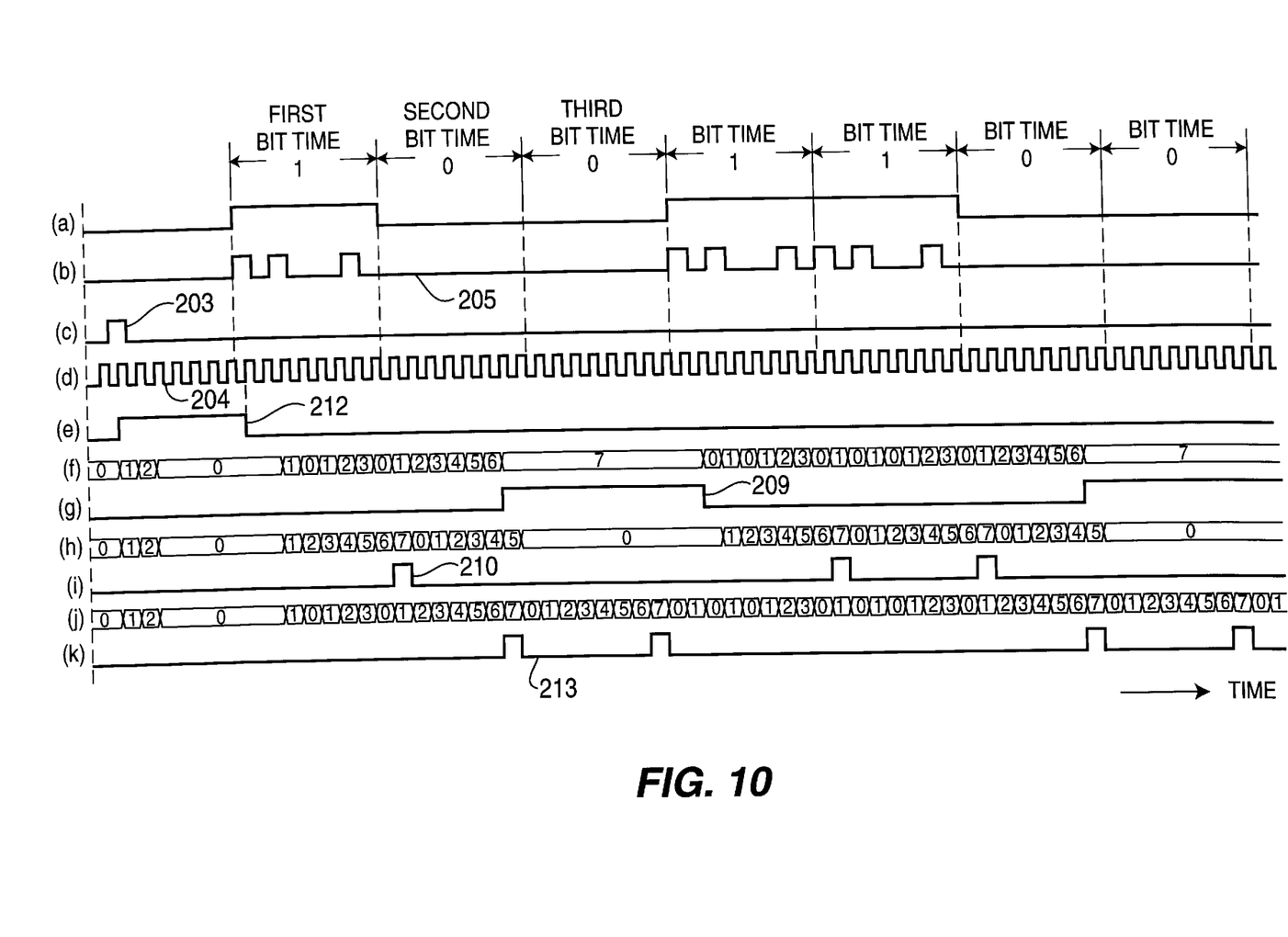

Control sequencer 214 synchronizes the operation of the decoder with the expected arrival of the encoded response signals. FIGS. 10(b), (c), (d) and (e) show the relationships among converted signal 205, trigger signal 203 and clock signal 204, respectively, that are provided as input signals to control sequencer 214, and sequencer output signal 212, which is the output signal of control sequencer 214. The function of control sequencer 214 is to initialize (or reset) decoder 200, whenever encoded responses are not expected. In another embodiment, the function of control sequencer 214 is to initialize decoder 200 just before encoded responses are expected.

As explained below, decoder 200 discriminates between ONEs and ZEROs in the encoded response signal, each ONE or ZERO having a bit time period. Ramp counter 206 and up counter 207 provide the first decoded output signal 210. The first decoded output signal is shown in FIG. 10(i) and is active, whenever at least one pulse in the encoded response signal 202 is present within a bit time period (FIG. 10a). Up counter 211 provides the second decoded output signal 213. The second decoded output signal is shown in FIG. 10(k) and is active, whenever no pulses are present in the encoded response signal 202 during the bit time period.

Ramp counter 206 and up counter 207 together are herein referred to as a first counter and up counter 211 is herein also referred to as a second counter.

As shown, converted signal 205 is provided as an input signal to ramp counter 206, up counter 211 and control sequencer 214. Clock signal 204 is provided as an input signal to ramp counter 206, up counter 207, up counter 211 and control sequencer 214. Trigger signal 203 is provided as an input signal to control sequencer 214. The output signal of control sequencer 214 is provided as an input signal to the reset (RST) input terminals of ramp counter 206, up counter 207 and up counter 211. The output signal of threshold comparator 201 is provided as an input signal to the other reset (RST) input terminals of ramp counter 206 and up counter 211. Finally, output signal 209 of ramp counter 206 is provided as an input signal to the other reset (RST) input terminal of up counter 207. If any one of the counters has only a single reset input terminal, the signals applied to the two reset input terminals shown in FIG. 9 may be logically ORed to generate a signal reset signal.

Up counter 211 is a free running wrap-around binary counter with two synchronous reset input terminals. The first reset input signal is provided by the converted encoded response signal 205. The second reset input signal is provided by sequencer output signal 212. The count value is reset and held at zero value, whenever any one or both reset input signals are active. The output signal of up counter 211 is active, whenever the count value equals the terminal count (explained later).

Ramp counter 206 is a free running binary counter which stops counting when the terminal count value is reached. The ramp counter has two synchronous reset input terminals. The ramp counter value is reset and held at zero value, whenever any one or both of the reset input signals are active. Output signal 209 is shown in FIG. 10(g) and is active, whenever the count value equals the terminal count.

Finally, up counter 207 is a free running wrap-around binary counter with two synchronous reset input terminals. The count value is reset and held at zero value, whenever any one or both of the reset input signals are active. Again, the output signal is active, whenever the count value equals the terminal count.

The terminal count values of ramp counter 206, up counter 207 and up counter 211 are the same and depend on the frequency of clock signal 204 and the response bit time period. For example, for a frequency of clock signal 204 equal to twice the frequency of clock signal 66 of the tag and the response bit time period equal to n cycles of clock signal 66 of the tag, the terminal count value is equal to 2n−1. In the example shown in FIG. 10(a), the bit time period is equal to 4 cycles of clock signal 66. This may be seen by observing that converted signal 205 (generated from the encoded response signal) of FIG. 10(b) has four complete cycles in one bit time period. Therefore, the terminal count is 2·4−1=7. It is also noted that clock signal 204 (FIG. 10(d)) is twice the frequency of converted signal 205 (or clock signal 66 of the tag).

Counting by ramp counter 206 is illustrated in FIG. 10(f). Counting by up counter 207 is shown in FIG. 10(h) and counting by up counter 211 is shown in FIG. 10(j). Each counter counts from 0 to 7. Signal 209 (FIG. 10(g)) becomes active, when ramp counter 206 counts up to 7. The first decoded output (signal 210 in FIG. 10(i)) becomes active, when up counter 207 counts up to 7. Finally, the second decoded output (signal 213 in FIG. 10(k)) becomes active, when up counter 211 counts up to 7.

In the example shown in FIG. 10(a), the combined response of the tags is "1001100". The first decoded output signal shown in FIG. 10(i) is "1_ _11_ _" representing the detection of three ONEs in the combined response. The second decoded output signal in FIG. 10(k) is "_11_ _11" representing the detection of four ZEROs in the combined response.

In operation, output signal 212 (FIG. 10e) resets the three free running counters. Unless reset by converted signal 205 (FIG. 10b), the three counters each count clock pulses 204 from 0 to 7 (the terminal count). Since clock pulses 204 are framed by, or coherent with the bit data stream, there should be 8 clock pulses in each bit time period (FIG. 10a), for example. Up counter 211 (FIG. 10j) continues to be reset by converted signal 205 during the first bit time period (ONE), but then counts up to 7 during the second bit time period (ZERO) and counts up to 7 again during the third bit time period (ZERO). Thus, second decoded output signal 213 (FIG. 10k) becomes a logic ONE, every time up counter 211 achieves a count of 7.

Ramp counter 206 (FIG. 10f) is continuously reset during the first bit time period (ONE) by converted signal 205 and does not achieve a count of 7 until the second bit time. In the meanwhile, up counter 207 (FIG. 10h), because it has not been reset by ramp counter 206, achieves a count of 7 and recognizes the first bit time period as a ONE. During the second and third bit time periods, however, ramp counter 206 achieves a count of 7 and resets up counter 207 with output signal 209 (FIG. 10g). Consequently, during the second and third bit periods, up counter 207 does not activate first decoded output signal 210 (FIG. 10i).

Although not shown, it will be appreciated that the first and second decoded output signals may be provided to the CPU in the I/R for identifying the response. In the embodiment shown in FIG. 9, two decoded output signals are provided to the CPU. Two output signals are necessary because the output signals are not mutually exclusive (the absence of the first decoded output signal does not mean the presence of the second decoded output signal). In another embodiment, the output signals may be modified. For example, the first decoded output signal may represent a ONE or a ZERO, while the second decoded output signal may represent that "the first decoded output signal is valid now." In this manner, decoder 200 may discriminate between a ONE and a ZERO.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention. It will be understood, for example, that the present invention is not limited to only the I/I system shown in FIG. 2. Rather, the invention may be extended to any system having multiple responding signals propagating through a communications medium, such as air, wire links or fiber optic links, for example.

What is claimed:

1. An apparatus for reducing coherent signal interference between at least two bit streams, each bit stream having been framed with a common clock signal, comprising
    an internal clock signal generated from the common clock signal,
    an encoder for encoding the internal clock signal with a unique signature,
    a logic AND gate for combining one bit stream of the at least two bit streams with the encoded internal clock signal to produce an encoded output signal,
    wherein when the encoded output signal is combined with another of the at least two bit streams during transmission, individual bits of the combined bit streams are identifiable at a receiving end.

2. The apparatus of claim 1 wherein the encoder includes a Manchester encoder for encoding the internal clock signal.

3. The apparatus of claim 1 wherein the encoder includes a re-circulating shift register having a serial output terminal, a serial input terminal, a parallel input terminal and a clock input terminal,
    wherein a serial output signal of the serial output terminal of the shift register is fed back to the serial input terminal,
    the internal clock signal is provided to the clock input terminal,
    the unique signature is provided to the parallel input terminal, and
    an exclusive-OR circuit combines the serial output signal of the shift register and the internal clock signal to produce the encoded clock signal.

4. The apparatus of claim 3 wherein the unique signature is a user selected bit pattern, and is loaded into the parallel input terminal of the shift register once during initialization.

5. The apparatus of claim 4 wherein the shift register has a length equal to a length of the user selected bit pattern, and
    the bit pattern is re-circulated once for every bit time period.

6. Apparatus for interrogating/identifying a plurality of coded tags comprising
    an interrogator/reader (I/R) for transmitting, at a carrier frequency to the tags, bit streams of data and for receiving response bit streams of data from the tags,
    the plurality of coded tags, each of the tags (a) storing a unique signature pattern and (b) generating bit streams of data for responding to the I/R,
    a clock signal generated by each tag from the carrier frequency,
    an encoder in each tag for encoding the clock signal with the unique signature pattern, and
    a circuit in each tag for modulating the encoded clock signal with the generated bit streams to produce the response bit streams from each tag.

7. The apparatus of claim 6 wherein the encoder includes a Manchester encoder for encoding the clock signal.

8. The apparatus of claim 6 wherein the encoder includes a re-circulating shift register having a serial output terminal, a serial input terminal, a parallel input terminal and a clock input terminal,
    wherein a serial output signal of the serial output terminal of the shift register is fed back to the serial input terminal,
    the clock signal is provided to the clock input terminal, and
    the signature pattern is provided to the parallel input terminal, and
    an exclusive-OR circuit combines the serial output signal of the shift register and the clock signal to produce the encoded clock signal.

9. The apparatus of claim 8 wherein the shift register has a length equal to a length of the signature pattern, and
    the signature pattern is re-circulated once for every bit time period.

10. A discriminator circuit for decoding a bit stream of pulses framed with a common clock signal, comprising
    a receiver for receiving the bit stream of pulses, wherein a predetermined number of pulses in the bit stream of pulses are contained in a bit time period of ONEs and ZEROs,
    clock pulses generated from the common clock signal and having a frequency value that is a multiple value of the frequency of the common clock signal,
    a first counter receiving the bit stream of pulses and counting the clock pulses, the first counter determining that a ONE is present in the bit stream of pulses when counting up to a predetermined value, and
    a second counter receiving the bit stream of pulses and counting the clock pulses, the second counter determining that a ZERO is present in the bit stream of pulses when counting up to the predetermined value.

11. The circuit of claim 10 wherein each counter is free running and counting clock pulses, being reset by each pulse in the bit stream, and
    the circuit includes a control sequencer for synchronizing a start time for counting the clock pulses.

12. The circuit of claim 11 wherein each pulse in the bit stream has a duration that is less than or equal to the bit time period and the first counter determines that a ONE is present when at least one pulse in the bit stream resets the first counter during the bit time period, and
    the second counter determines that a ZERO is present when pulses in the bit stream do not reset the second counter during the bit time period.

13. The circuit of claim 10 wherein the receiver includes a threshold comparator for converting the bit stream of pulses to a logic level compatible for the first and second counters.

14. Apparatus for interrogating/identifying coded tags, including an interrogator/reader (I/R) for transmitting, at a carrier frequency, to the tags, bit streams of data and for receiving response bit streams of data from each tag, the response bit streams of data including ONEs and ZEROs, the apparatus comprising     a receiver for receiving the response bit streams of data, wherein the response bit streams include data framed with a common clock signal,     an internal clock signal generated from the common clock signal and having a frequency value that is a multiple value of the frequency of the common clock signal,     a first counter receiving the response bit streams of data and responsive to the clock signal, the first counter providing an output signal when at least one bit of data is present in the response bit streams of data during a predetermined interval, and     a second counter receiving the response bit streams of data and clocked by the clock signal, the second counter providing an output signal when no bits of data are present in the response bit streams of data during the predetermined interval,     wherein when the first counter provides the output signal, a ONE is present in the bit streams of data and when the second counter provides the output signal, a ZERO is present in the bit streams of data.

15. The circuit of claim 14 wherein the receiver includes a threshold comparator for converting the bit stream to a logic level compatible with the first and second counters.

16. The circuit of claim 14 wherein each of the first and second counters is free running and counts pulses of the clock signal, and     the circuit includes a control sequencer for synchronizing a start time for counting the pulses of the clock signal.

17. The circuit of claim 16 wherein each bit of data in the bit stream has a duration that is less than or equal to the predetermined interval, and the first counter provides the output signal when at least one bit of data in the bit stream is present during the predetermined interval, and     the second counter provides the output signal when bits of data are not present during the predetermined interval.

* * * * *